United States Patent
Lin

(10) Patent No.: US 12,081,200 B2
(45) Date of Patent: Sep. 3, 2024

(54) CLOCK SWITCHING DEVICE

(71) Applicant: Nuvoton Technology Corporation, Hsinchu (TW)

(72) Inventor: Chun-Wei Lin, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 17/938,948

(22) Filed: Sep. 7, 2022

(65) Prior Publication Data

US 2023/0421144 A1    Dec. 28, 2023

(30) Foreign Application Priority Data

Jun. 23, 2022   (TW) ................................. 111123479

(51) Int. Cl.
*G06F 1/04* (2006.01)
*G06F 1/08* (2006.01)
*H03K 3/037* (2006.01)
*H03K 17/00* (2006.01)
*H03K 19/20* (2006.01)

(52) U.S. Cl.
CPC ............. *H03K 17/005* (2013.01); *G06F 1/04* (2013.01); *G06F 1/08* (2013.01); *H03K 3/037* (2013.01); *H03K 19/20* (2013.01)

(58) Field of Classification Search
CPC ..... G06F 1/04; G06F 1/06; G06F 1/08; G06F 1/10; G06F 1/12; H03K 3/037; H03K 17/005; H03K 19/20; H03K 19/21
See application file for complete search history.

(56) References Cited

U.S. PATENT DOCUMENTS

| | | | |
|---|---|---|---|
| 6,600,345 B1 * | 7/2003 | Boutaud ................... | G06F 1/08 327/99 |
| 8,860,468 B1 * | 10/2014 | Khandelwal .............. | G06F 1/08 327/99 |
| 2022/0014204 A1 | 1/2022 | Hutton et al. | |

FOREIGN PATENT DOCUMENTS

TW           200812218         3/2008

* cited by examiner

*Primary Examiner* — Long Nguyen
(74) *Attorney, Agent, or Firm* — JCIPRNET

(57) ABSTRACT

Provided is a clock switching device including a first latch circuit, a second latch circuit, and a switching circuit. The first latch circuit latches a first selection signal based on triggering of a first clock signal. The second latch circuit latches a second selection signal based on triggering of a second clock signal. A reset terminal of the second latch circuit is coupled to the first latch circuit. The second latch circuit is selectively reset based on an output of the first latch circuit. The switching circuit is coupled to an output terminal of the first latch circuit and an output terminal of the second latch circuit. The switching circuit selects one of the clock signals as an output clock signal of the clock switching device based on the selection signals.

9 Claims, 9 Drawing Sheets

CLOCK SWITCHING DEVICE

CROSS-REFERENCE TO RELATED APPLICATION

This application claims the priority benefit of Taiwanese application no. 111123479, filed on Jun. 23, 2022. The entirety of the above-mentioned patent application is hereby incorporated by reference herein and made a part of this specification.

BACKGROUND

Technical Field

The disclosure relates to an electronic circuit, and in particular to a clock switching device.

Description of Related Art

Operation of electronic circuits requires a clock signal. Generally speaking, an electronic circuit may require a plurality of clock signals. For example, a computer system may contain a core clock signal (for a central processing unit (CPU)), a system bus clock signal, and a peripheral clock signal. These clock signals may have different speeds/frequencies. The same functional circuit may require different clock signals at different times. For example, the CPU requires a high-frequency clock signal in a high-efficiency mode, and a low-frequency clock signal in a power-saving mode. A clock switching device may select one of a plurality of clock signals, and transmit the selected clock signal to the functional circuit. How to realize the clock switching device is one of many technical topics in the related field.

It should be noted that the contents of the section of "Description of Related Art" is used to help understand the disclosure. Some (or all) of the content disclosed in the section of "Description of Related Art" may not pertain to the conventional technology known to persons with ordinary skills in the art. The content disclosed in the section of "Description of Related Art" does not mean to have been known to persons with ordinary skills in the art prior to the time of filing this application.

SUMMARY

The disclosure provides a clock switching device to select one of a plurality of clock signals for a functional circuit according to a selection signal.

In an embodiment of the disclosure, the clock switching device includes a first latch circuit, a second latch circuit, and a switching circuit. The first latch circuit is configured to latch a first selection signal among a plurality of selection signals based on triggering of a first clock signal among a plurality of clock signals. The second latch circuit is configured to latch a second selection signal among the selection signals based on triggering of a second clock signal among the clock signals. A reset terminal of the second latch circuit is coupled to the first latch circuit, and the second latch circuit is selectively reset based on an output of the first latch circuit. The switching circuit is coupled to an output terminal of the first latch circuit and an output terminal of the second latch circuit. The switching circuit selects one of the clock signals as an output clock signal of the clock switching device based on the selection signals.

Based on the foregoing, the clock switching device according to the embodiments of the disclosure includes the plurality of latch circuits configured to latch different selection signals. The switching circuit may select one corresponding clock signal from the plurality of clock signals for the functional circuit based on the latch contents (the selection signals) of the latch circuits. When the second clock signal is missing and the second latch circuit cannot be triggered, the output of the first latch circuit may immediately reset the second latch circuit, so that the switching circuit may select at least the first clock signal for the functional circuit.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
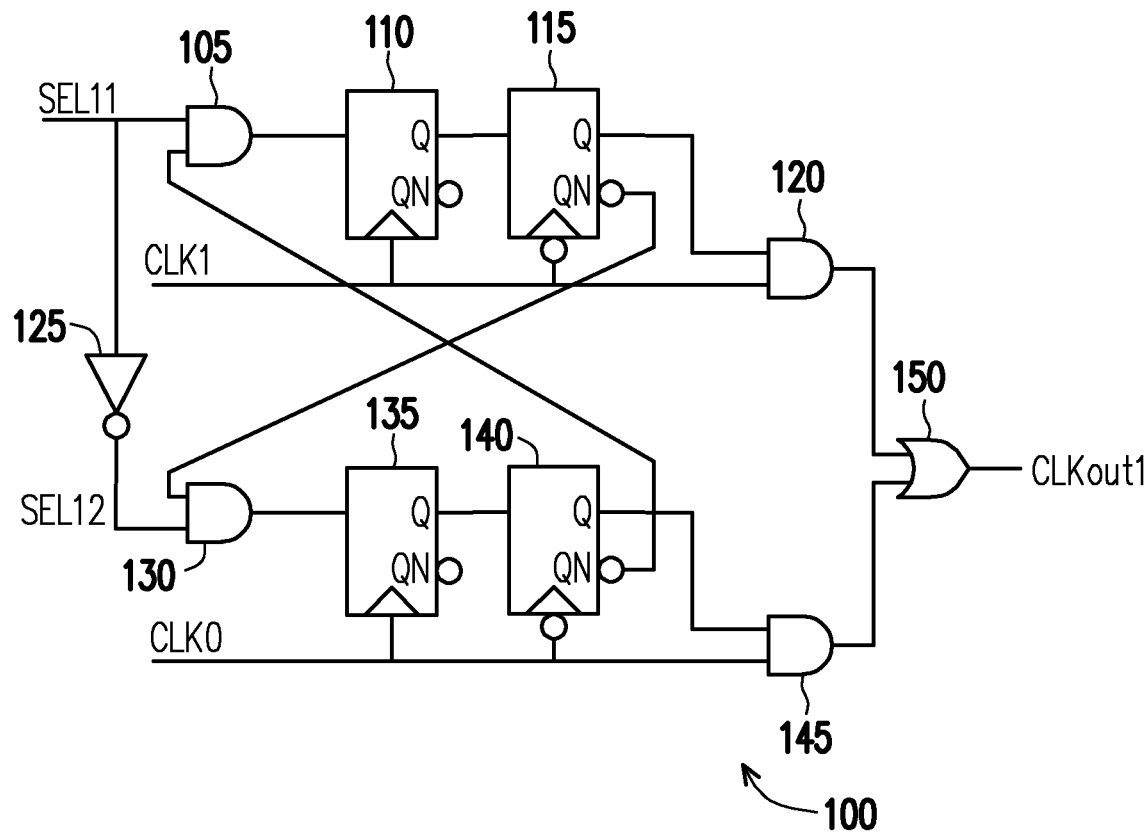
FIG. 1 is a schematic circuit block diagram of an embodiment of a glitch-free clock switch.

The term "coupling (or connection)" as used throughout this specification (including the claims) may refer to any direct or indirect means of connection. For example, if it is herein described that a first device is coupled (or connected) to a second device, it should be interpreted that the first device may be directly connected to the second device, or the first device may be indirectly connected to the second device through other devices or some connection means. Terms such as "first" and "second" mentioned through out the description (including the claims) are used to name elements, or to distinguish between different embodiments or scopes, and are not used to limit the upper or lower bound of the number of elements, nor used to limit the sequence of elements. In addition, wherever possible, elements/members/steps using the same reference numerals in the drawings and embodiments denote the same or similar parts. Cross-reference may be made to relevant descriptions of elements/members/steps using the same reference numerals or using the same terms in different embodiments.

FIG. 1 is a schematic circuit block diagram of an embodiment of a glitch-free clock switch 100. The glitch-free clock switch 100 includes an AND gate 105, a flip-flop 110, a flip-flop 115, an AND gate 120, a NOT gate 125, an AND gate 130, a flip-flop 135, a flip-flop 140, an AND gate 145, and an OR gate 150. A first input terminal of the AND gate 105 receives a selection signal SEL11. An input terminal of the flip-flop 110 is coupled to an output terminal of the AND gate 105. A trigger terminal of the flip-flop 110 receives a clock signal CLK1. An input terminal of the flip-flop 115 is coupled to an output terminal Q of the flip-flop 110. A trigger terminal of the flip-flop 115 receives the clock signal CLK1. A first input terminal of the AND gate 120 is coupled to a first output terminal Q of the flip-flop 115 to receive the selection signal SEL11. A second input terminal of the AND gate 120 receives the clock signal CLK1.

An input terminal of the NOT gate 125 receives the selection signal SEL11. A first input terminal of the AND gate 130 is coupled to an output terminal of the NOT gate 125 to receive a selection signal SEL12 (an inverted signal of the selection signal SEL11). A second input terminal of the AND gate 130 is coupled to a second output terminal QN of the flip-flop 115. An input terminal of the flip-flop 135 is coupled to an output terminal of the AND gate 130. A trigger terminal of the flip-flop 135 receives a clock signal CLK0. An input terminal of the flip-flop 140 is coupled to an output terminal Q of the flip-flop 135. A trigger terminal of the flip-flop 140 receives the clock signal CLK0. A second output terminal QN of the flip-flop 140 is coupled to a second input terminal of the AND gate 105. A first input terminal of the AND gate 145 is coupled to a first output terminal Q of the flip-flop 140 to receive the selection signal SEL12. A second input terminal of the AND gate 145 receives the clock signal CLK0. A first input terminal and a second input terminal of the OR gate 150 are respectively coupled to an output terminal of the AND gate 120 and an output terminal of the AND gate 145. An output terminal of the OR gate 150 outputs an output clock signal CLKout1 of the glitch-free clock switch 100.

When the selection signal SEL11 is at a low logic level, the selection signal SEL12 is at a high logic level. Based on the clock signals CLK1 and CLK0, the flip-flops 110 and 115 may latch the selection signal SEL11 and transmit the selection signal SEL11 to the AND gate 120, and the flip-flops 135 and 140 may latch the selection signal SEL12 and transmit the selection signal SEL12 to the AND gate 145. Based on the selection signals SEL11 and SEL12, the AND gate 120 may block the clock signal CLK1, and the AND gate 145 may transmit the clock signal CLK0 to the OR gate 150. Therefore, the OR gate 150 may output the clock signal CLK0 as the output clock signal CLKout1. Similarly, when the selection signal SEL11 is at a high logic level (the selection signal SEL12 is at a low logic level), the AND gate 145 may block the clock signal CLK0, and the AND gate 120 may transmit the clock signal CLK1 to the OR gate 150. Therefore, the OR gate 150 may output the clock signal CLK1 as the output clock signal CLKout1.

Figure 2:
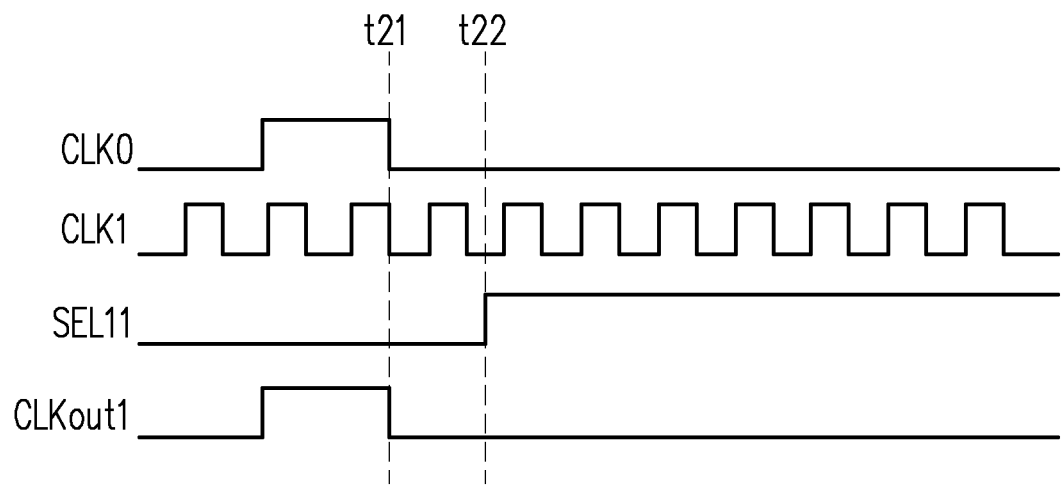
FIG. 2 is a schematic waveform diagram of the output clock signal of the circuit shown in FIG. 1 in the case where the clock signal is missing.

FIG. 2 is a schematic waveform diagram of the output clock signal CLKout1 of the circuit shown in FIG. 1 in the case where the clock signal CLK0 is missing. The horizontal axis of FIG. 2 represents time. With reference to FIG. 1 and FIG. 2 together, after the time t21, the clock signal CLK0 is missing. At the time t22, the selection signal SEL11 is transitioned from a low logic level to a high logic level, so the voltage level of the output terminal of the AND gate 130 is transitioned from a high logic level to a low logic level. However, since the clock signal CLK0 is missing, the low logic level of the selection signal SEL12 cannot be updated to the first output terminal Q of the flip-flop 140, causing the first output terminal Q of the flip-flop 140 to be maintained at the former (erroneous) high logic level, and the second output terminal QN of the flip-flop 140 to be maintained at the former (erroneous) low logic level. The erroneous level of the second output terminal QN of the flip-flop 140 causes the AND gate 105 to erroneously block transmission of the selection signal SEL11, which causes the AND gate 120 to block the clock signal CLK1 and the AND gate 145 to continuously transmit the missing clock signal CLK0 to the OR gate 150. Therefore, the output clock signal CLKout1 is also missing, causing failure (or malfunction) the entire system.

Figure 3:
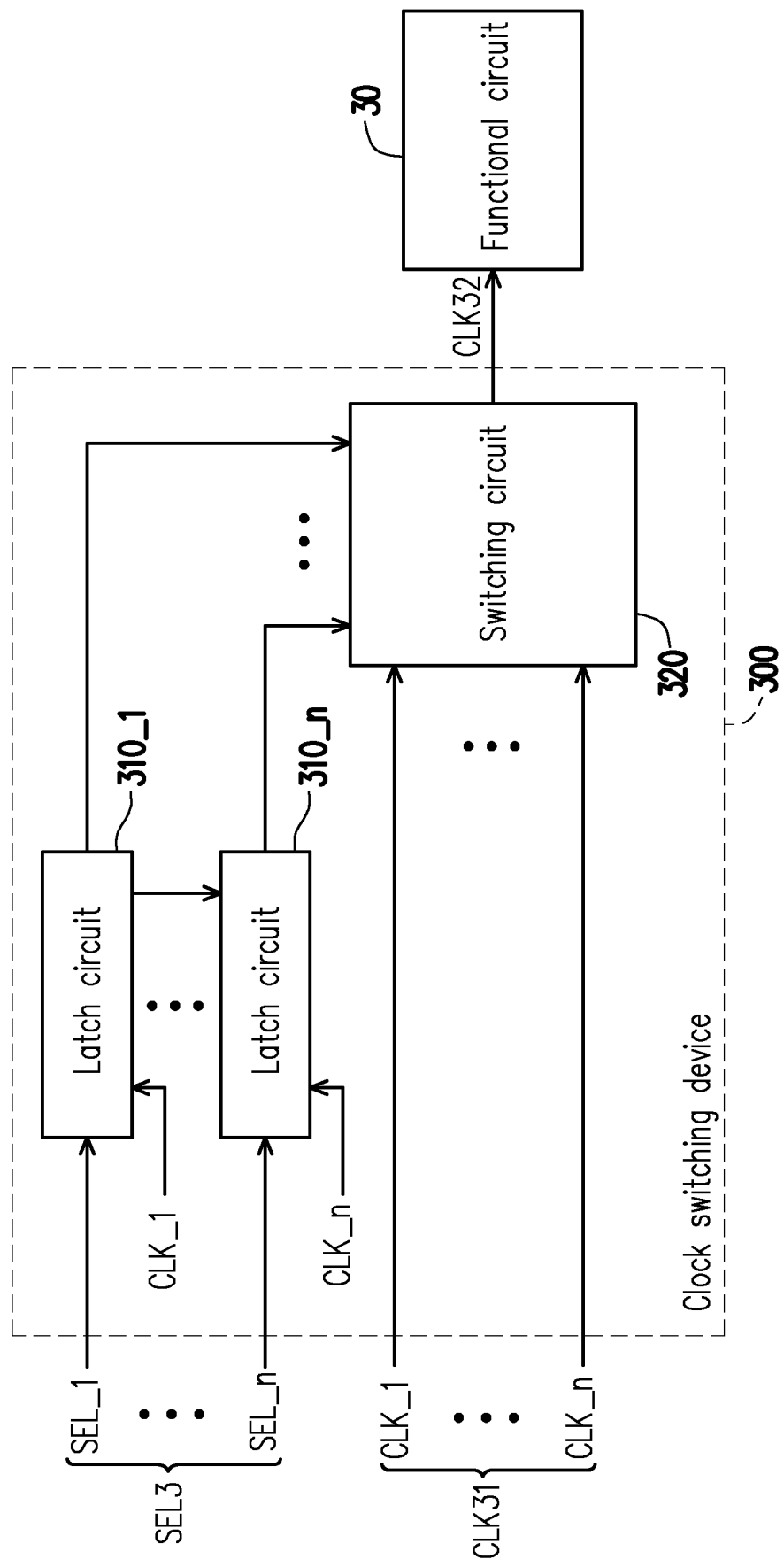
FIG. 3 is a schematic circuit block diagram of a clock switching device according to an embodiment of the disclosure.

FIG. 3 is a schematic circuit block diagram of a clock switching device 300 according to an embodiment of the disclosure. It is assumed here that a clock signal CLK31 includes n clock signals CLK_1, . . . , CLK_n, where n is an arbitrary integer (n is greater than 1) determined depending on the actual design. The clock switching device 300 may select one corresponding clock signal from the plurality of clock signals CLK_1 to CLK_n as an output clock signal CLK32 for a functional circuit 30 according to the control of a selection signal SEL3. When the selection signal SEL3 changes selection from the clock signal CLK_n to the clock signal CLK_1 while the clock signal CLK_n is missing, the clock switching device 300 may automatically select at least the clock signal CLK_1 for the functional circuit 30, instead of being affected by the clock signal CLK_n missing, to maintain the normal operation of the functional circuit 30.

In the embodiment shown in FIG. 3, the clock switching device 300 includes a plurality of latch circuits, for example, latch circuits 310_1, . . . , 310_n. It is assumed here that the selection signal SEL3 includes n selection signals SEL_1, . . . , SEL_n. The latch circuit 310_1 latches the selection signal SEL_1 in the selection signal SEL3 based on triggering of the clock signal CLK_1 in the clock signal CLK31. The latch circuit 310_n latches the selection signal SEL_n in the selection signal SEL3 based on triggering of the clock signal CLK_n in the clock signal CLK31. A reset terminal of the latch circuit 310_n is coupled to the latch circuit 310_1. The latch circuit 310_n is selectively reset based on an output of the latch circuit 310_1. For other latch circuits not shown in FIG. 3, analogy may be made with reference to the relevant description of the latch circuit 310_n, which will therefore not be repeated here.

In the embodiment shown in FIG. 3, the clock switching device 300 further includes a switching circuit 320. The switching circuit 320 is coupled to an output terminal of each of the latch circuits 310_1 to 310_n. The switching circuit 320 selects one of the clock signals CLK_1 to CLK_n as the output clock signal CLK32 of the clock switching device 300 based on the selection signals SEL_1 to SEL_n. The switching circuit 320 may select one corresponding clock signal from the plurality of clock signals CLK_1 to CLK_n, as the output clock signal CLK32, for the functional circuit 30 based on the latch contents (the selection signals SEL_1 to SEL_n) of the latch circuits 310_1 to 310_n. When the selection signal SEL3 changes selection from the clock signal CLK_n to the clock signal CLK_1 while the clock signal CLK_n is missing and the latch circuit 310_n cannot be triggered, the output of the latch circuit 310_1 may immediately reset the latch circuit 310_n to eliminate the influence of the missing clock signal CLK_n, so that the switching circuit 320 may select at least the clock signal CLK_1 for the functional circuit 30.

In this embodiment, the implementations of the latch circuits 310_1 to 310_n and the switching circuit 320 are not limited. For example, depending on the actual design, for the latch circuit 310_1 shown in FIG. 3, reference may be made to the relevant description of the latch circuit 310_1 shown in FIG. 4, FIG. 5, FIG. 6, FIG. 9, FIG. 10, or FIG. 11. For other latch circuits (e.g., the latch circuit 310_n) shown in FIG. 3, reference may be made to the relevant description of the latch circuit 310_2 shown in FIG. 4, the latch circuit 310_2 or 310_3 shown in FIG. 5, the latch circuit 310_2 shown in FIG. 6, the latch circuit 310_2 or 310_3 shown in FIG. 9, the latch circuit 310_2 shown in FIG. 10, or the latch circuit 310_2 or 310_3 shown in FIG. 11. For the switching circuit 320 shown in FIG. 3, reference may be made to the relevant description of the switching circuit 320 shown in FIG. 4, FIG. 5, FIG. 6, FIG. 9, FIG. 10, or FIG. 11.

Figure 4:
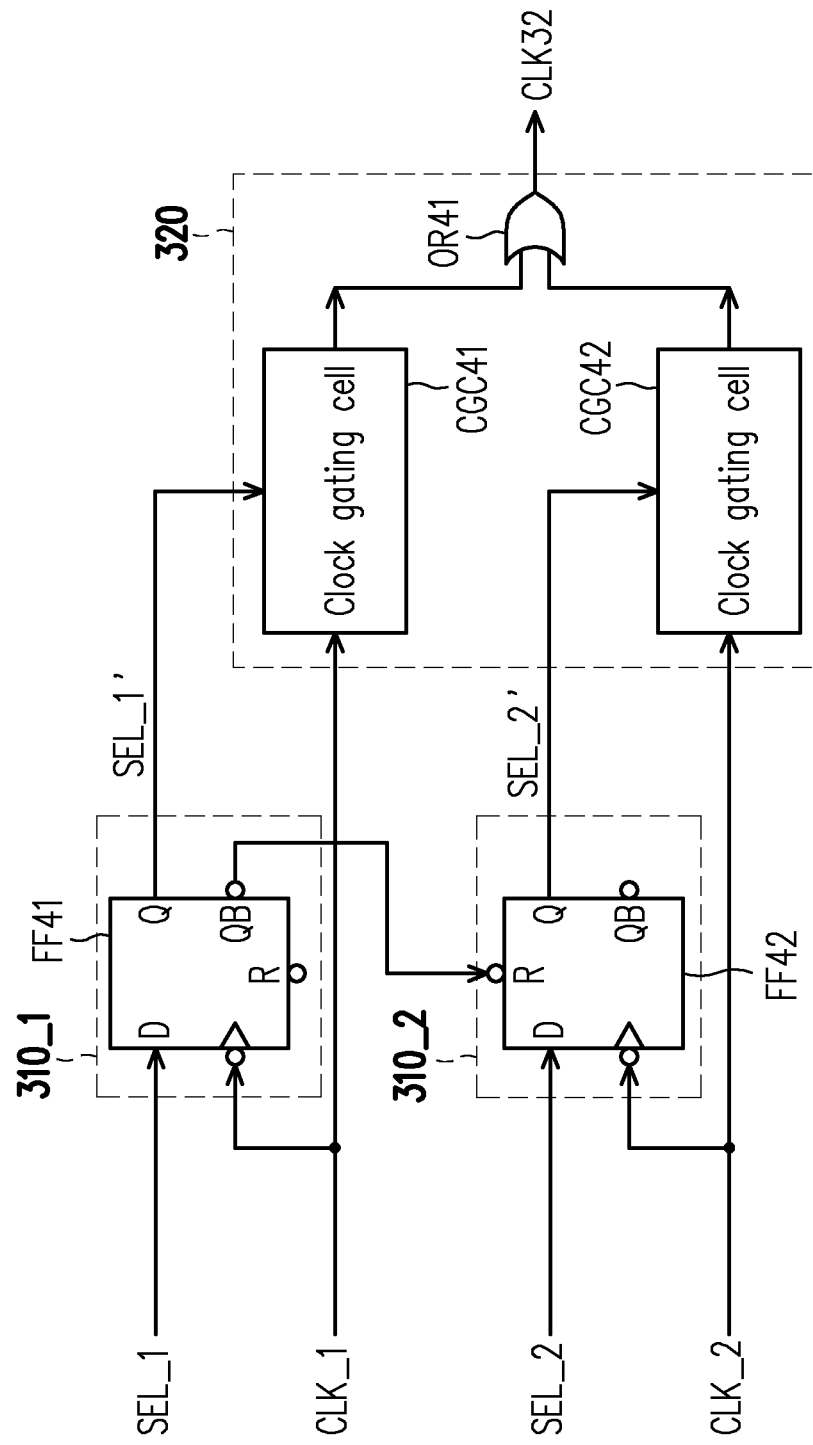
FIG. 4 is a schematic circuit block diagram of a latch circuit and a switching circuit according to an embodiment of the disclosure.

FIG. 4 is a schematic circuit block diagram of a latch circuit and a switching circuit according to an embodiment of the disclosure. In the embodiment shown in FIG. 4, the latch circuit 310_1 includes a flip-flop FF41. An input terminal D of the flip-flop FF41 receives the selection signal SEL_1 in the selection signal SEL3. An output terminal Q of the flip-flop FF41 is coupled to a clock gating cell CGC41 of the switching circuit 320 to provide a selection signal SEL_1'. An output terminal QB of the flip-flop FF41 is coupled to a reset terminal R of a flip-flop FF42 of the latch circuit 310_2 to reset the latch circuit 310_2. A trigger terminal of the flip-flop FF41 receives the clock signal CLK_1 in the clock signal CLK31. In the embodiment shown in FIG. 4, the trigger terminal of the flip-flop FF41 is a falling-edge trigger terminal. In other embodiments, the trigger terminal of the flip-flop FF41 may be a rising-edge trigger terminal.

In the embodiment shown in FIG. 4, the latch circuit 310_2 includes the flip-flop FF42. An input terminal of the flip-flop FF42 receives the selection signal SEL_2 in the selection signal SEL3. An output terminal of the flip-flop FF42 is coupled to a clock gating cell CGC42 of the switching circuit 320 to provide a selection signal SEL_2'. In the embodiment shown in FIG. 4, the reset terminal R of the flip-flop FF42 is an inverting input terminal. The reset terminal R of the flip-flop FF42 is coupled to the output terminal QB of the flip-flop FF41 of the latch circuit 310_1. In other embodiments, the reset terminal R of the flip-flop FF42 may instead be coupled to the output terminal Q of the flip-flop FF41 in the case where the reset terminal R of the flip-flop FF42 is a non-inverting input terminal. A trigger terminal of the flip-flop FF42 receives the clock signal CLK_2 in the clock signal CLK31. In the embodiment shown in FIG. 4, the trigger terminal of the flip-flop FF42 is a falling-edge trigger terminal. In other embodiments, the trigger terminal of the flip-flop FF42 may be a rising-edge trigger terminal.

In the embodiment shown in FIG. 4, the switching circuit 320 includes the clock gating cell CGC41, the clock gating cell CGC42, and an OR gate OR41. The clock gating cell shown in FIG. 4 may be a conventional clock gating cell or other clock gating cells depending on the actual design. A control terminal of the clock gating cell CGC41 is coupled to the latch circuit 310_1 to receive the selection signal SEL_1'. An input terminal of the clock gating cell CGC41 receives the clock signal CLK_1. A control terminal of the clock gating cell CGC42 is coupled to the latch circuit 310_2 to receive the selection signal SEL_2'. An input terminal of the clock gating cell CGC42 receives the clock signal CLK_2. A first input terminal and a second input terminal of the OR gate OR41 are respectively coupled to an output terminal of the clock gating cell CGC41 and an output terminal of the clock gating cell CGC42. The output terminal of the OR gate OR41 outputs the output clock signal CLK32 of the clock switching device 300. The switching circuit 320 may select one corresponding clock signal from the plurality of clock signals CLK_1 and CLK_2 as the output clock signal CLK32 based on the latch contents (the selection signals SEL_1' and SEL_2') of the latch circuits 310_1 and 310_2.

In the case where the reset terminal R of the flip-flop FF42 is not coupled to the latch circuit 310_1, when the clock signal CLK_2 is missing, although the selection signal SEL_2 is transitioned from a high logic level to a low logic level (i.e., the selection signal SEL_1 is transitioned from a low logic level to a high logic level), since the latch circuit 310_2 is not triggered, the selection signal SEL_2' is caused to be maintained at an erroneous high logic level. In the case where the reset terminal R of the flip-flop FF42 is coupled to the latch circuit 310_1, even if the clock signal CLK_2 is missing and the latch circuit 310_2 is not triggered, the output of the latch circuit 310_1 may immediately reset the latch circuit 310_2 (i.e., immediately transition the selection signal SEL_2' from a high logic level to a low logic level) to eliminate the influence of the missing clock signal CLK_n. Therefore, the clock gating cell CGC42 may block the clock signal CLK_2, and the clock gating cell CGC41 may transmit the clock signal CLK_1 to the OR gate OR41, so that the OR gate OR41 may output the clock signal CLK_1 as the output clock signal CLK32.

Figure 5:
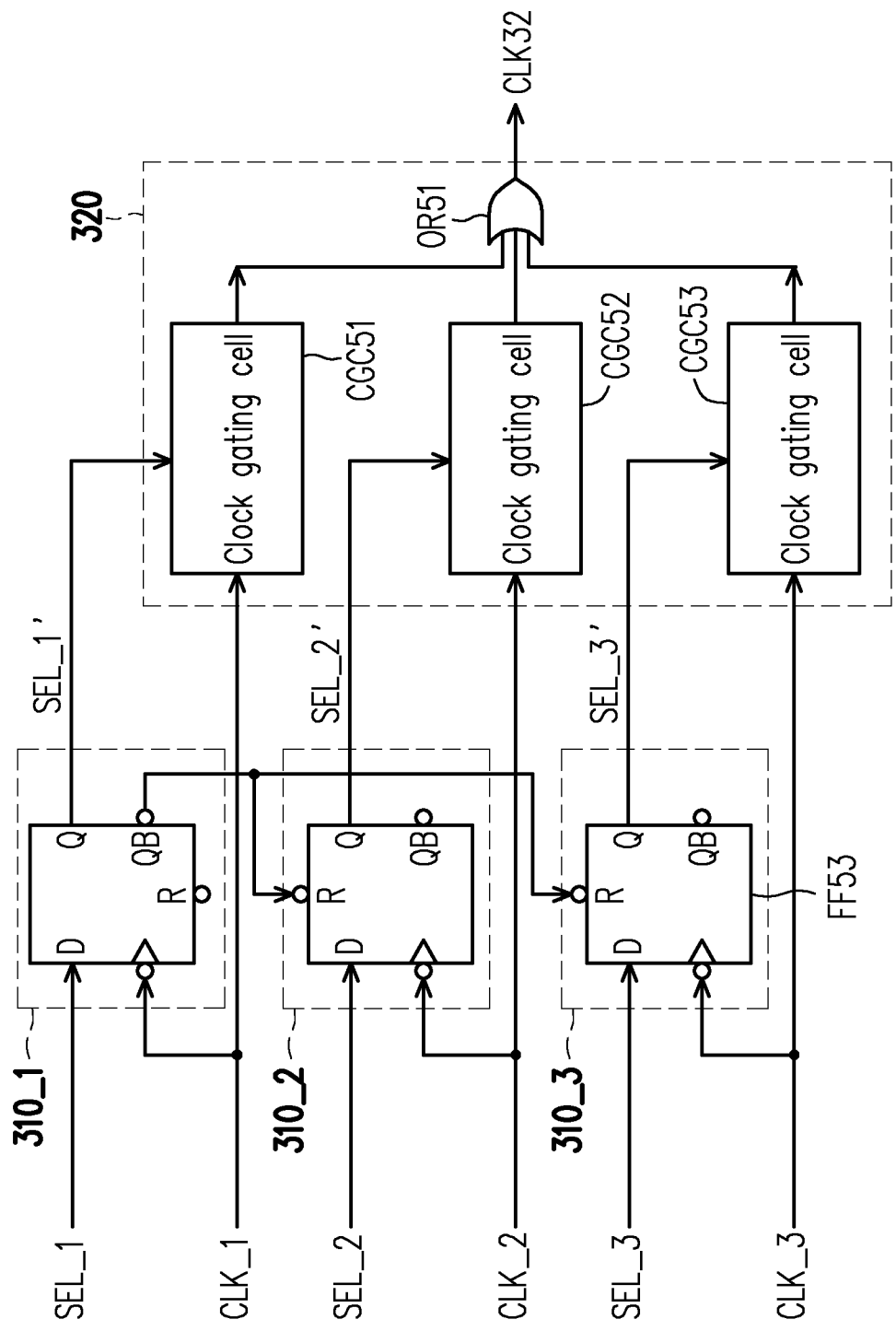
FIG. 5 is a schematic circuit block diagram of a latch circuit and a switching circuit according to an embodiment of the disclosure.

FIG. 5 is a schematic circuit block diagram of a latch circuit and a switching circuit according to an embodiment of the disclosure. For the latch circuit 310_1 and the latch circuit 310_2 shown in FIG. 5, reference may be made to the relevant description of the latch circuit 310_1 and the latch circuit 310_2 shown in FIG. 4, which will therefore not be repeated. In the embodiment shown in FIG. 5, the clock switching device 300 further includes the latch circuit 310_3 compared with the embodiment shown in FIG. 4. The latch circuit 310_3 latches the selection signal SEL_3 in the selection signal SEL3 based on triggering of the clock signal CLK_3 in the clock signal CLK31. The output terminal of the latch circuit 310_3 is coupled to the switching circuit 320. A reset terminal of the latch circuit 310_3 is coupled to the latch circuit 310_1. The latch circuit 310_3 is selectively reset based on the output of the latch circuit 310_1. For the latch circuit 310_3 shown in FIG. 5, analogy may be made with reference to the relevant description of the latch circuit 310_2 shown in FIG. 4.

In the embodiment shown in FIG. 5, the latch circuit 310_3 includes a flip-flop FF53. An input terminal D of the flip-flop FF53 receives the selection signal SEL_3. An output terminal Q of the flip-flop FF53 is coupled to the switching circuit 320 to provide a selection signal SEL_3'. A reset terminal R of the flip-flop FF53 is coupled to the latch circuit 310_1. A trigger terminal of the flip-flop FF53 receives the clock signal CLK_3. For the flip-flop FF53 shown in FIG. 5, analogy may be made with reference to the relevant description of the flip-flop FF42 shown in FIG. 4, which will therefore not be repeated.

In the embodiment shown in FIG. 5, the switching circuit 320 includes a clock gating cell CGC51, a clock gating cell CGC52, a clock gating cell CGC53, and an OR gate OR51. A control terminal of the clock gating cell CGC51 is coupled to the latch circuit 310_1 to receive the selection signal SEL_1'. An input terminal of the clock gating cell CGC51 receives the clock signal CLK_1. A control terminal of the clock gating cell CGC52 is coupled to the latch circuit 310_2 to receive the selection signal SEL_2'. An input terminal of the clock gating cell CGC52 receives the clock signal CLK_2. A control terminal of the clock gating cell CGC53 is coupled to the latch circuit 310_3 to receive the selection signal SEL_3'. An input terminal of the clock gating cell CGC53 receives the clock signal CLK_3. A first input terminal, a second input terminal, and a third input terminal of the OR gate OR51 are respectively coupled to output terminals of the clock gating cells CGC51, CGC52, and CGC53. An output terminal of the OR gate OR51 outputs the output clock signal CLK32 of the clock switching device 300. For the clock gating cells CGC51, CGC52, and CGC53 shown in FIG. 5, reference may be made to the relevant description of the clock gating cells CGC41 and CGC42 shown in FIG. 4; and for the OR gate OR51 shown in FIG. 5, reference may be made to the relevant description of the OR gate OR41 shown in FIG. 4, which will therefore not be repeated.

Figure 6:
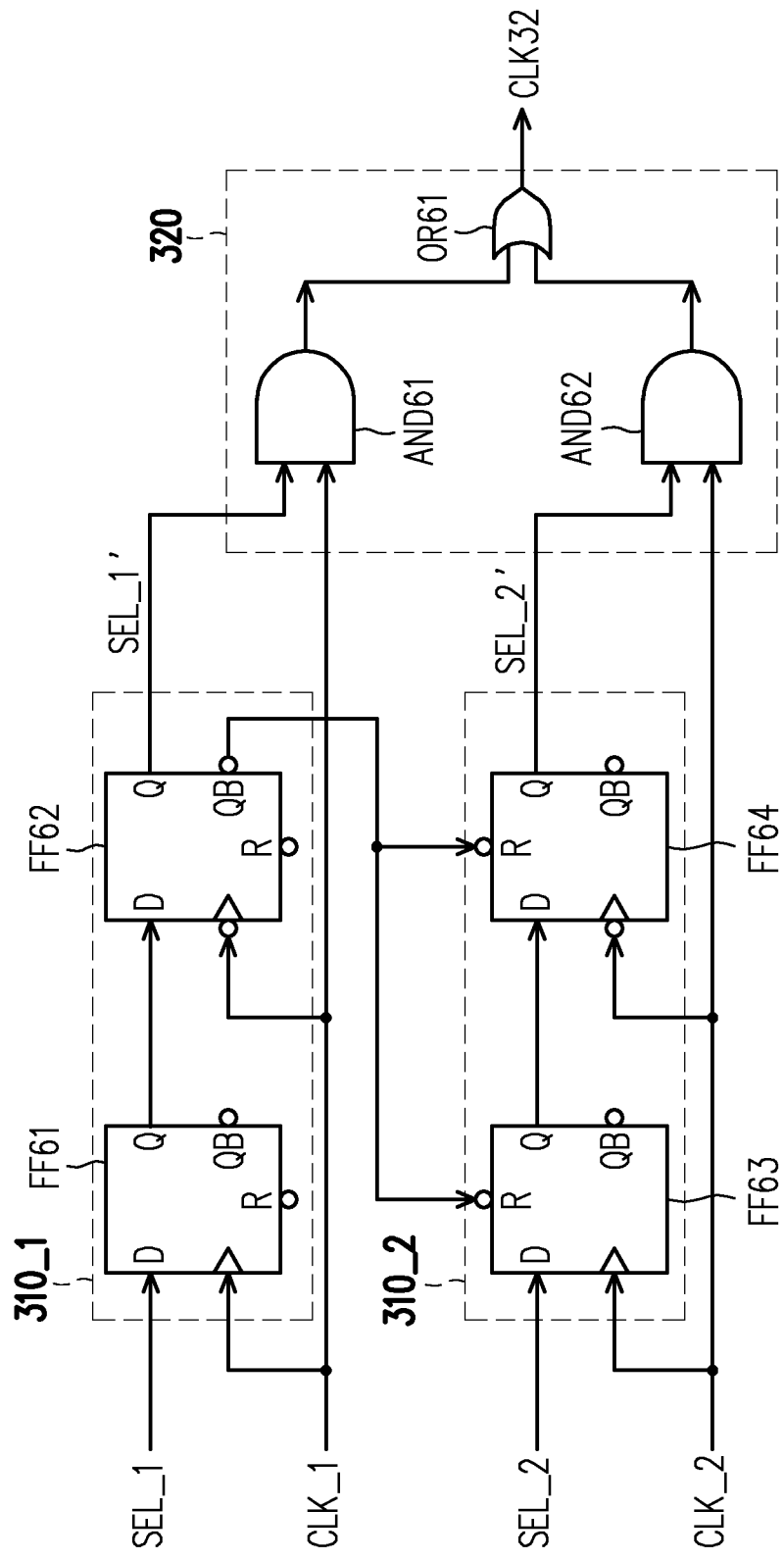
FIG. 6 is a schematic circuit block diagram of a latch circuit and a switching circuit according to an embodiment of the disclosure.

FIG. 6 is a schematic circuit block diagram of a latch circuit and a switching circuit according to an embodiment of the disclosure. In the embodiment shown in FIG. 6, the latch circuit 310_1 includes a flip-flop FF61 and a flip-flop FF62, the latch circuit 310_2 includes a flip-flop FF63 and a flip-flop FF64, and the switching circuit 320 includes an AND gate AND61, an AND gate AND62, and an OR gate OR61. An input terminal D of the flip-flop FF61 receives the selection signal SEL_1 in the selection signal SEL3. A trigger terminal of the flip-flop FF61 receives the clock signal CLK_1 in the clock signal CLK31. An input terminal D of the flip-flop FF62 is coupled to an output terminal Q of the flip-flop FF61. A trigger terminal of the flip-flop FF62 receives the clock signal CLK_1. An output terminal Q of the flip-flop FF62 is coupled to the AND gate AND61 of the switching circuit 320 to provide the selection signal SEL_1'.

One of an output terminal QB and the output terminal Q of the flip-flop FF62 is coupled to a reset terminal R of the flip-flop FF63 and a reset terminal R of the flip-flop FF64 in the latch circuit 310_2 to reset the latch circuit 310_2. The reset terminal R of the flip-flop FF63 and the reset terminal R of the flip-flop FF64 shown in FIG. 6 are each an inverting input terminal, so the output terminal QB of the flip-flop FF62 is coupled to the reset terminal R of the flip-flop FF63 and the reset terminal R of the flip-flop FF64. In other embodiments, in the case where the reset terminal R of the flip-flop FF63 and the reset terminal R of the flip-flop FF64 are each a non-inverting input terminal, the output terminal Q of the flip-flop FF62 is instead coupled to the reset terminal R of the flip-flop FF63 and the reset terminal R of the flip-flop FF64.

In the embodiment shown in FIG. 6, the trigger terminal of the flip-flop FF61 is a rising-edge trigger terminal, and the trigger terminal of the flip-flop FF62 is a falling-edge trigger terminal. In other embodiments, the trigger terminal of the flip-flop FF61 may be a falling-edge trigger terminal, and the trigger terminal of the flip-flop FF62 may be a rising-edge trigger terminal. In yet other embodiments, the trigger terminal of the flip-flop FF61 and the trigger terminal of the flip-flop FF62 are each a rising-edge trigger terminal. In still other embodiments, the trigger terminal of the flip-flop FF61 and the trigger terminal of the flip-flop FF62 are each a falling-edge trigger terminal.

An input terminal D of the flip-flop FF63 receives the selection signal SEL_2 in the selection signal SEL3. A trigger terminal of the flip-flop FF63 receives the clock signal CLK_2 in the clock signal CLK31. The reset terminal R of the flip-flop FF63 is coupled to the latch circuit 310_1. An input terminal D of the flip-flop FF64 is coupled to an output terminal Q of the flip-flop FF63. An output terminal Q of the flip-flop FF64 is coupled to the AND gate AND62 of the switching circuit 320 to provide the selection signal SEL_2'. The reset terminal R of the flip-flop FF64 is coupled to the latch circuit 310_1. A trigger terminal of the flip-flop FF64 receives the clock signal CLK_2.

In the embodiment shown in FIG. 6, the trigger terminal of the flip-flop FF63 is a rising-edge trigger terminal, and the trigger terminal of the flip-flop FF64 is a falling-edge trigger terminal. In other embodiments, the trigger terminal of the flip-flop FF63 may be a falling-edge trigger terminal, and the trigger terminal of the flip-flop FF64 may be a rising-edge trigger terminal. In yet other embodiments, the trigger terminal of the flip-flop FF63 and the trigger terminal of the flip-flop FF64 are each a rising-edge trigger terminal. In still other embodiments, the trigger terminal of the flip-flop FF63 and the trigger terminal of the flip-flop FF64 are each a falling-edge trigger terminal.

A first input terminal of the AND gate AND61 is coupled to the latch circuit 310_1 to receive the selection signal SEL_1'. A second input terminal of the AND gate AND61 receives the clock signal CLK_1. A first input terminal of the AND gate AND62 is coupled to the latch circuit 310_2 to receive the selection signal SEL_2'. A second input terminal of the AND gate AND62 receives the clock signal CLK_2. A first input terminal and a second input terminal of the OR gate OR61 are respectively coupled to an output terminal of the AND gate AND61 and an output terminal of the AND gate AND62. An output terminal of the OR gate OR61 outputs the output clock signal CLK32 of the clock switching device 300. The switching circuit 320 may select one corresponding clock signal from the plurality of clock signals CLK_1 and CLK_2 as the output clock signal CLK32 based on the latch contents (the selection signals SEL_1' and SEL_2') of the latch circuits 310_1 and 310_2.

Figure 7:
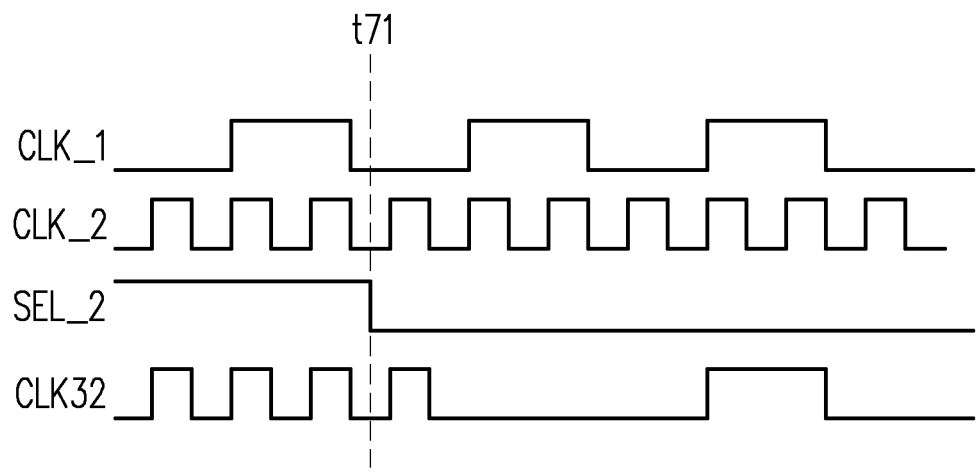
FIG. 7 is a schematic waveform diagram of the output clock signal of the circuit shown in FIG. 6 according to an embodiment of the disclosure.

FIG. 7 is a schematic waveform diagram of the output clock signal CLK32 of the circuit shown in FIG. 6 according to an embodiment of the disclosure. The horizontal axis of FIG. 7 represents time. With reference to FIG. 6 and FIG. 7 together, before the time t71, the selection signal SEL_2 is at a high logic level (i.e., the selection signal SEL_1 is at a low logic level). The flip-flops FF61 and FF62 latch the selection signal SEL_1 based on triggering of the clock signal CLK_1 and output the selection signal SEL_1' with a low logic level. The flip-flops FF63 and FF64 latch the selection signal SEL_2 based on triggering of the clock signal CLK_2 and output the selection signal SEL_2' with a high logic level. The AND gate AND61 may block the clock signal CLK_1 based on the selection signal SEL_1', and the AND gate AND62 may transmit the clock signal CLK_2 to the OR gate OR61 based on the selection signal SEL_2'. Therefore, the OR gate OR61 may output the clock signal CLK_2 as the output clock signal CLK32.

After the time t71, the selection signal SEL_2 is transitioned from a high logic level to a low logic level (i.e., the selection signal SEL_1 is transitioned from a low logic level to a high logic level). The flip-flops FF61 and FF62 latch the selection signal SEL_1 based on triggering of the clock signal CLK_1 and output the selection signal SEL_1' with a high logic level. The flip-flops FF63 and FF64 latch the selection signal SEL_2 based on triggering of the clock signal CLK_2 and output the selection signal SEL_2' with a low logic level. The AND gate AND62 may block the clock signal CLK_2 based on the selection signal SEL_2', and the AND gate AND61 may transmit the clock signal CLK_1 to the OR gate OR61 based on the selection signal SEL_1'. Therefore, after the time t71, the output clock signal CLK32 output by the OR gate OR61 may be switched from the clock signal CLK_2 to the clock signal CLK_1.

Figure 8:
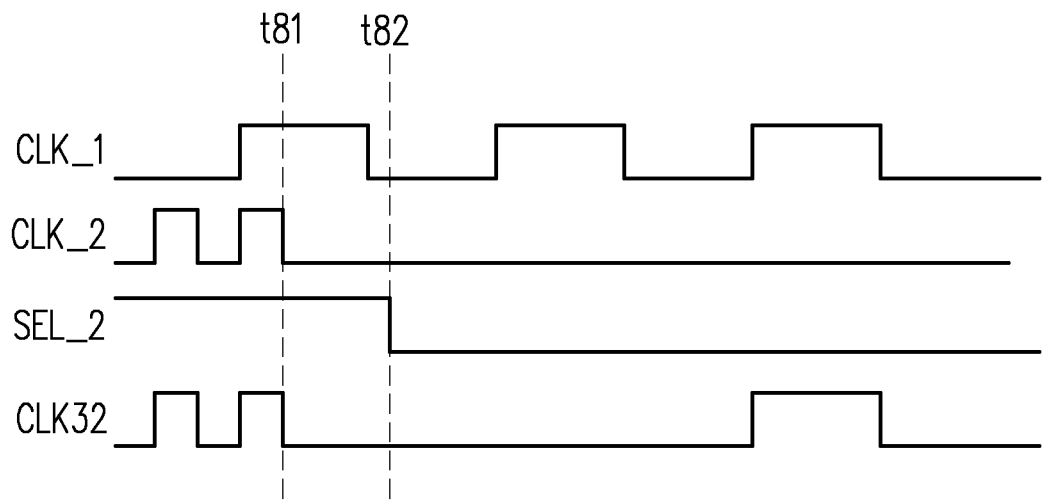
FIG. 8 is a schematic waveform diagram of the output clock signal of the circuit shown in FIG. 6 in the case where the clock signal is missing.

FIG. 8 is a schematic waveform diagram of the output clock signal CLK32 of the circuit shown in FIG. 6 in the case where the clock signal CLK_2 is missing. The horizontal axis of FIG. 8 represents time. With reference to FIG. 6 and FIG. 8 together, before the time t82, the selection signal SEL_2 is at a high logic level (i.e., the selection signal SEL_1 is at a low logic level). Therefore, the OR gate OR61 may output the clock signal CLK_2 as the output clock signal CLK32 (reference may be made to the relevant description before the time t71 shown in FIG. 7 for the details). The difference from the scenario example shown in FIG. 7 is that the clock signal CLK_2 is missing after the time t81 shown in FIG. 8.

After the time t82 shown in FIG. 8, the selection signal SEL_2 is transitioned from a high logic level to a low logic level (i.e., the selection signal SEL_1 is transitioned from a low logic level to a high logic level). Since the clock signal CLK_2 is missing, the flip-flops FF63 and FF64 cannot update the latch contents. The flip-flops FF61 and FF62 may latch the selection signal SEL_1 based on triggering of the clock signal CLK_1 and output the selection signal SEL_1' with a high logic level. At the same time, the output terminal QB of the flip-flop FF62 may output a low logic level to the reset terminal R of the flip-flop FF63 and the reset terminal R of the flip-flop FF64 to immediately reset the latch circuit 310_2, i.e., immediately transition the selection signal SEL_2' from a high logic level to a low logic level. The AND gate AND62 may block the missing clock signal CLK_2 based on the selection signal SEL_2' with a low logic level, and the AND gate AND61 may transmit the clock signal CLK_1 to the OR gate OR61 based on the selection signal SEL_1' with a high logic level. Therefore, the OR gate OR61 may output the clock signal CLK_1 as the output clock signal CLK32.

Figure 9:
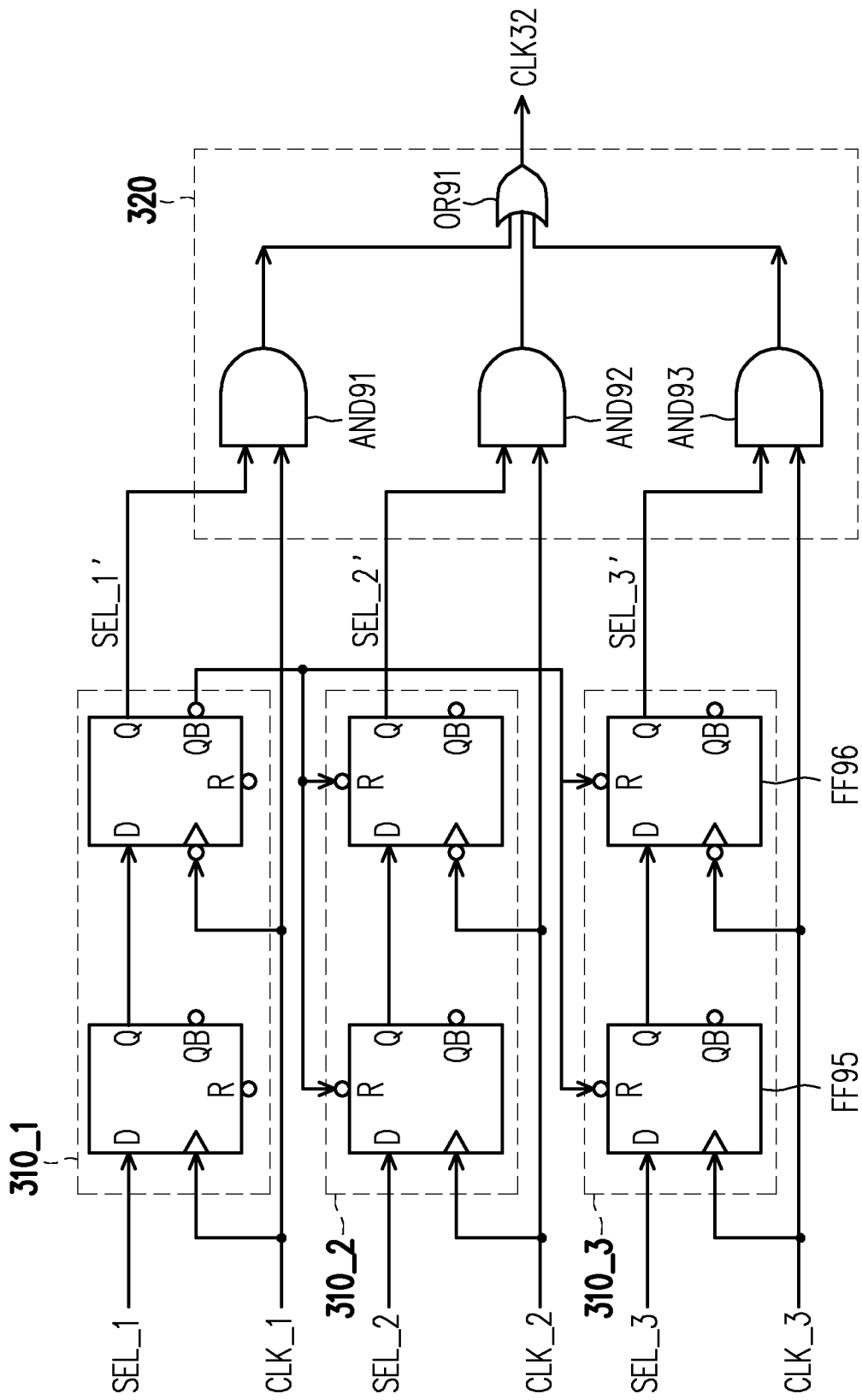
FIG. 9 is a schematic circuit block diagram of a latch circuit and a switching circuit according to an embodiment of the disclosure.

FIG. 9 is a schematic circuit block diagram of a latch circuit and a switching circuit according to an embodiment of the disclosure. For the latch circuit 310_1 and the latch circuit 310_2 shown in FIG. 9, reference may be made to the relevant description of the latch circuit 310_1 and the latch circuit 310_2 shown in FIG. 6, which will therefore not be repeated. In the embodiment shown in FIG. 9, the clock switching device 300 further includes the latch circuit 310_3 compared with the embodiment shown in FIG. 6. The latch circuit 310_3 latches the selection signal SEL_3 in the selection signal SEL3 based on triggering of the clock signal CLK_3 in the clock signal CLK31. The output terminal of the latch circuit 310_3 is coupled to the switching circuit 320. The reset terminal of the latch circuit 310_3 is coupled to the latch circuit 310_1. The latch circuit 310_3 is selectively reset based on the output of the latch circuit 310_1. For the latch circuit 310_3 shown in FIG. 9, analogy may be made with reference to the relevant description of the latch circuit 310_2 shown in FIG. 6.

In the embodiment shown in FIG. 9, the latch circuit 310_3 includes a flip-flop FF95 and a flip-flop FF96. An input terminal of the flip-flop FF95 receives the selection signal SEL_3. A trigger terminal of the flip-flop FF95 receives the clock signal CLK_3. A reset terminal R of the flip-flop FF95 is coupled to the latch circuit 310_1. An input terminal of the flip-flop FF96 is coupled to an output terminal Q of the flip-flop FF95. An output terminal Q of the flip-flop FF96 is coupled to the switching circuit 320 to provide the selection signal SEL_3'. A reset terminal R of the flip-flop FF96 is coupled to the latch circuit 310_1. A trigger terminal of the flip-flop FF96 receives the clock signal CLK_3. For the flip-flops FF95 and FF96 shown in FIG. 9, analogy may be made with reference to the relevant description of the flip-flops FF63 and FF64 shown in FIG. 6, which will therefore not be repeated.

In the embodiment shown in FIG. 9, the switching circuit 320 includes an AND gate AND91, an AND gate AND92, an AND gate AND93, and an OR gate OR91. A first input terminal of the AND gate AND91 is coupled to the latch circuit 310_1 to receive the selection signal SEL_1'. A second input terminal of the AND gate AND91 receives the clock signal CLK_1. A first input terminal of the AND gate AND92 is coupled to the latch circuit 310_2 to receive the selection signal SEL_2'. A second input terminal of the AND gate AND92 receives the clock signal CLK_2. A first input terminal of the AND gate AND93 is coupled to the latch circuit 310_3 to receive the selection signal SEL_3'. A second input terminal of the AND gate AND93 receives the clock signal CLK_3. A first input terminal, a second input terminal, and a third input terminal of the OR gate OR91 are respectively coupled to output terminals of the AND gates AND91, AND92, and AND93. An output terminal of the OR gate OR91 outputs the output clock signal CLK32 of the clock switching device 300. For the AND gates AND91, AND92, and AND93 shown in FIG. 9, reference may be made to the relevant description of the AND gates AND61 and AND62 shown in FIG. 6; and for the OR gate OR91 shown in FIG. 9, reference may be made to the relevant description of the OR gate OR61 shown in FIG. 6, which will therefore not be repeated here.

Figure 10:
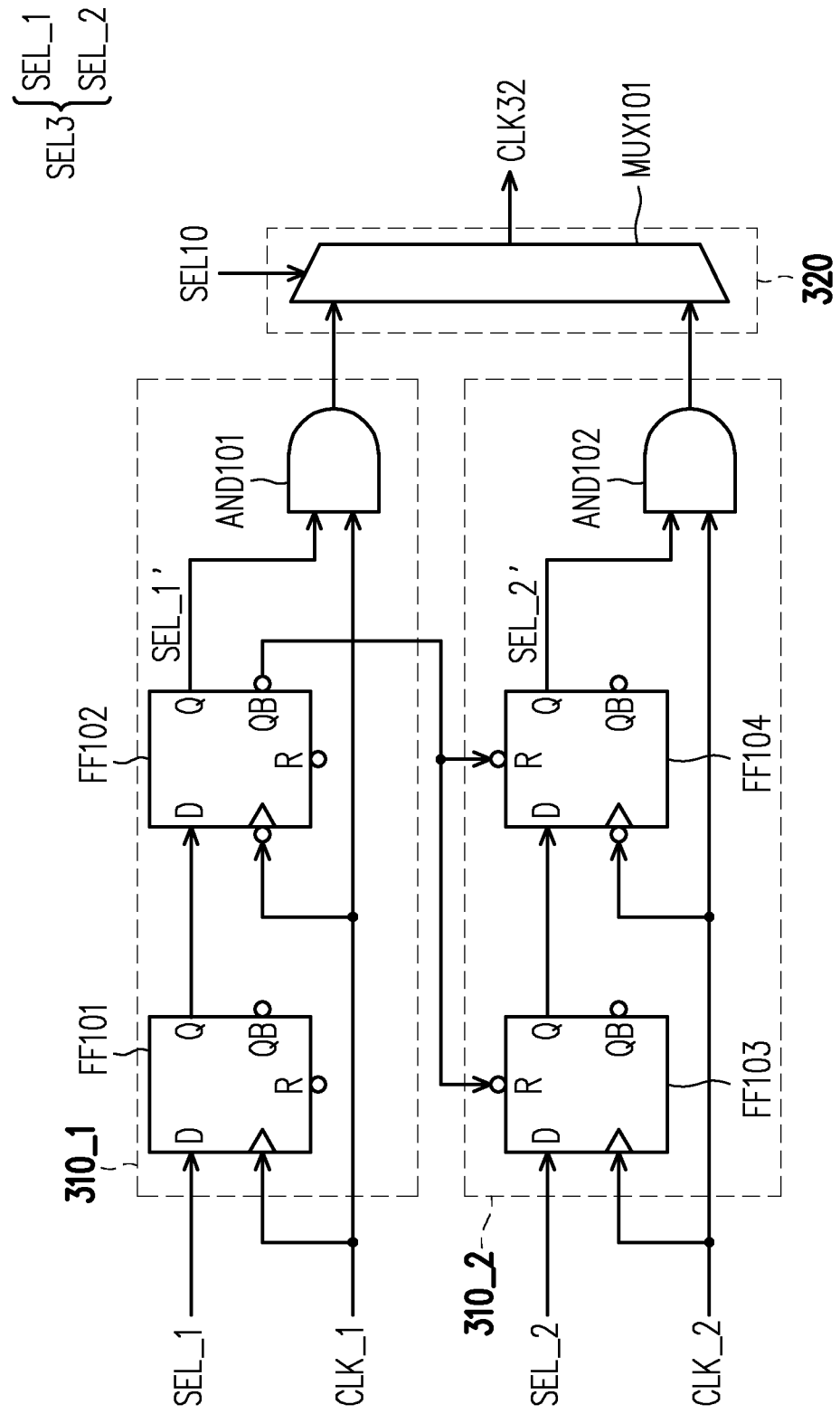
FIG. 10 is a schematic circuit block diagram of a latch circuit and a switching circuit according to an embodiment of the disclosure.

FIG. 10 is a schematic circuit block diagram of a latch circuit and a switching circuit according to an embodiment of the disclosure. In the embodiment shown in FIG. 10, the latch circuit 310_1 includes a flip-flop FF101, a flip-flop FF102, and an AND gate AND101; the latch circuit 310_2 includes a flip-flop FF103, a flip-flop FF104, and an AND gate AND102; and the switching circuit 320 includes a multiplexer MUX101. A first input terminal of the AND gate AND101 receives the clock signal CLK_1 in the clock signal CLK31.

An input terminal D of the flip-flop FF101 receives the selection signal SEL_1 in the selection signal SEL3. A trigger terminal of the flip-flop FF101 receives the clock signal CLK_1. An input terminal D of the flip-flop FF102 is coupled to an output terminal Q of the flip-flop FF101. A trigger terminal of the flip-flop FF102 receives the clock signal CLK_1. An output terminal Q of the flip-flop FF102 is coupled to a second input terminal of the AND gate AND101 to provide the latch content (the selection signal SEL_1'). An output terminal of the AND gate AND101 is coupled to the multiplexer MUX101 of the switching circuit 320.

One of an output terminal QB and the output terminal Q of the flip-flop FF102 is coupled to a reset terminal R of the flip-flop FF103 and a reset terminal R of the flip-flop FF104 in the latch circuit 310_2 to reset the latch circuit 310_2. The reset terminal R of the flip-flop FF103 and the reset terminal R of the flip-flop FF104 shown in FIG. 10 are each an inverting input terminal, so the output terminal QB of the flip-flop FF102 is coupled to the reset terminal R of the flip-flop FF103 and the reset terminal R of the flip-flop FF104. In other embodiments, in the case where the reset terminal R of the flip-flop FF103 and the reset terminal R of the flip-flop FF104 are each a non-inverting input terminal, the output terminal Q of the flip-flop FF102 is instead coupled to the reset terminal R of the flip-flop FF103 and the reset terminal R of the flip-flop FF104.

In the embodiment shown in FIG. 10, the trigger terminal of the flip-flop FF101 is a rising-edge trigger terminal, and the trigger terminal of the flip-flop FF102 is a falling-edge trigger terminal. In other embodiments, the trigger terminal of the flip-flop FF101 may be a falling-edge trigger terminal, and the trigger terminal of the flip-flop FF102 may be a rising-edge trigger terminal. In yet other embodiments, the trigger terminal of the flip-flop FF101 and the trigger terminal of the flip-flop FF102 are each a rising-edge trigger terminal. In still other embodiments, the trigger terminal of the flip-flop FF101 and the trigger terminal of the flip-flop FF102 are each a falling-edge trigger terminal.

A first input terminal of the AND gate AND102 receives the clock signal CLK_2 in the clock signal CLK31. An input terminal D of the flip-flop FF103 receives the selection signal SEL_2 in the selection signal SEL3. A trigger terminal of the flip-flop FF103 receives the clock signal CLK_2. The reset terminal R of the flip-flop FF103 is coupled to the latch circuit 310_1. An input terminal D of the flip-flop FF104 is coupled to an output terminal Q of the flip-flop FF103. The reset terminal R of the flip-flop FF104 is coupled to the latch circuit 310_1. A trigger terminal of the flip-flop FF104 receives the clock signal CLK_2. An output terminal Q of the flip-flop FF104 is coupled to a second input terminal of the AND gate AND102 to provide the selection signal SEL_2'. An output terminal of the AND gate AND102 is coupled to the multiplexer MUX101 of the switching circuit 320.

In the embodiment shown in FIG. 10, the trigger terminal of the flip-flop FF103 is a rising-edge trigger terminal, and the trigger terminal of the flip-flop FF104 is a falling-edge trigger terminal. In other embodiments, the trigger terminal of the flip-flop FF103 may be a falling-edge trigger terminal, and the trigger terminal of the flip-flop FF104 may be a rising-edge trigger terminal. In yet other embodiments, the trigger terminal of the flip-flop FF103 and the trigger terminal of the flip-flop FF104 are each a rising-edge trigger terminal. In still other embodiments, the trigger terminal of the flip-flop FF103 and the trigger terminal of the flip-flop FF104 are each a falling-edge trigger terminal.

A first input terminal of the multiplexer MUX101 is coupled to the output terminal of the AND gate AND101 of the latch circuit 310_1. A second input terminal of the multiplexer MUX101 is coupled to the output terminal of the AND gate AND102 of the latch circuit 310_2. An output terminal of the multiplexer MUX101 outputs the output clock signal CLK32 of the clock switching device 300. The multiplexer MUX101 is controlled by a selection signal SEL10. In some embodiments, the selection signal SEL10 includes the selection signal SEL_1' provided by the flip-flop FF102 and the selection signal SEL_2' provided by the flip-flop FF104. In other embodiments, the selection signal SEL10 may be the selection signal SEL3. When the selection signal SEL10 selects the clock signal CLK_1, i.e., the selection signal SEL_2 is at a low logic level and the selection signal SEL_1 is at a high logic level, the multiplexer MUX101 selects the output of one of the AND gates AND101 and AND102 as the output clock signal CLK32.

Figure 11:
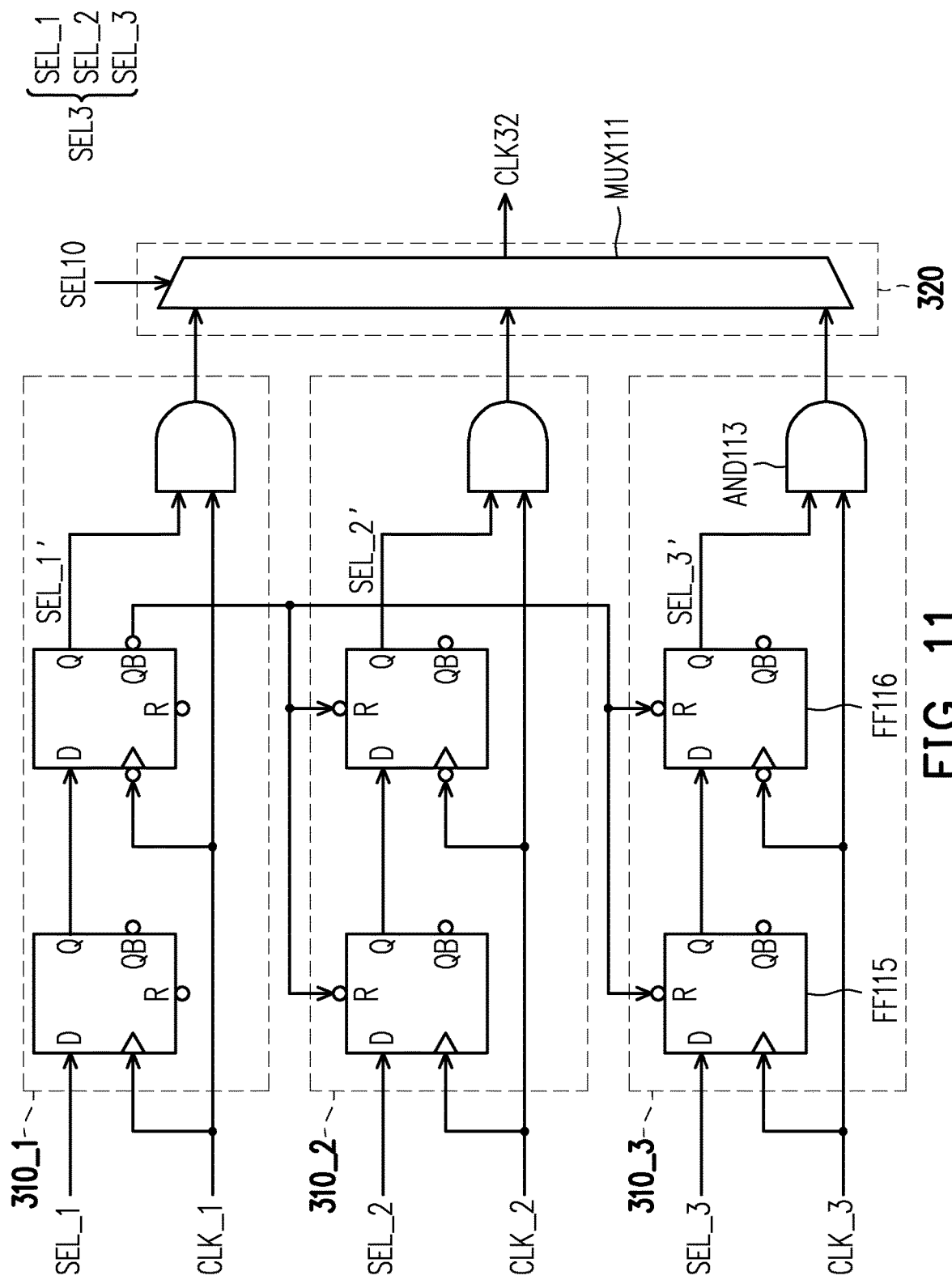
FIG. 11 is a schematic circuit block diagram of a latch circuit and a switching circuit according to an embodiment of the disclosure.

FIG. 11 is a schematic circuit block diagram of a latch circuit and a switching circuit according to an embodiment of the disclosure. For the latch circuit 310_1 and the latch circuit 310_2 shown in FIG. 11, reference may be made to the relevant description of the latch circuit 310_1 and the latch circuit 310_2 shown in FIG. 10, which will therefore not be repeated. In the embodiment shown in FIG. 11, the clock switching device 300 further includes the latch circuit 310_3 compared with the embodiment shown in FIG. 10. The latch circuit 310_3 latches the selection signal SEL_3 in the selection signal SEL3 based on triggering of the clock signal CLK_3 in the clock signal CLK31. The output terminal of the latch circuit 310_3 is coupled to the switching circuit 320. The reset terminal of the latch circuit 310_3 is coupled to the latch circuit 310_1. The latch circuit 310_3 is selectively reset based on the output of the latch circuit 310_1. For the latch circuit 310_3 shown in FIG. 11, analogy may be made with reference to the relevant description of the latch circuit 310_2 shown in FIG. 10.

In the embodiment shown in FIG. 11, the latch circuit 310_3 includes a flip-flop FF115, a flip-flop FF116, and an AND gate AND113. A first input terminal of the AND gate AND113 receives the clock signal CLK_3. An input terminal of the flip-flop FF115 receives the selection signal SEL_3. A trigger terminal of the flip-flop FF115 receives the clock signal CLK_3. A reset terminal R of the flip-flop FF115 is coupled to the latch circuit 310_1. An input terminal of the flip-flop FF116 is coupled to an output terminal Q of the flip-flop FF115. An output terminal Q of the flip-flop FF116 is coupled to a second input terminal of the AND gate AND113 to provide the selection signal SEL_3'. A reset terminal R of the flip-flop FF116 is coupled to the latch circuit 310_1. A trigger terminal of the flip-flop FF116 receives the clock signal CLK_3. An output terminal of the AND gate AND113 is coupled to the switching circuit 320. For the flip-flop FF115, the flip-flop FF116, and the AND gate AND113 shown in FIG. 11, analogy may be made with reference to the relevant description of the flip-flop FF103, the flip-flop FF104, and the AND gate AND102 shown in FIG. 10, which will therefore not be repeated.

In the embodiment shown in FIG. 11, the switching circuit 320 includes a multiplexer MUX111. A first input terminal of the multiplexer MUX111 is coupled to the output terminal of the latch circuit 310_1. A second input terminal of the multiplexer MUX111 is coupled to the output terminal of the latch circuit 310_2. A third input terminal of the multiplexer MUX111 is coupled to the output terminal of the latch circuit 310_3. An output terminal of the multiplexer MUX111 outputs the output clock signal CLK32 of the clock switching device 300. The multiplexer MUX111 is controlled by the selection signal SEL10. In some embodiments, the selection signal SEL10 includes the selection signals SEL_1', SEL_2', and SEL_3'. In other embodiments, the selection signal SEL10 may be the selection signal SEL3. For the multiplexer MUX111 shown in FIG. 11, reference may be made to the related description of the multiplexer MUX101 shown in FIG. 10, which will therefore not be repeated.

In summary of the foregoing, the clock switching device 300 according to the embodiments above include the plurality of the latch circuits 310_1 to 310_n configured to latch different selection signals SEL_1 to SEL_n. The switching circuit 320 may select one corresponding clock signal from the plurality of clock signals CLK_1 to CLK_n, as the output clock signal CLK32, for the functional circuit 30 based on the latch contents (the selection signals SEL_1 to SEL_n) of the latch circuits 310_1 to 310_n. When one of the clock signals (e.g., the clock signal CLK_n) is missing and one of the latch circuits (e.g., the latch circuit 310_n) cannot be triggered, the output of the latch circuit 310_1 may immediately reset other latch circuits, so that switching circuit 320 may select at least the clock signal CLK_1 for the functional circuit 30.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A clock switching device comprising:
    a first latch circuit configured to latch a first selection signal among a plurality of selection signals for outputting a first latched selection signal among a plurality of latched selection signals based on triggering of a first clock signal among a plurality of clock signals;
    a second latch circuit configured to latch a second selection signal among the selection signals for outputting a second latched selection signal among the latched selection signals based on triggering of a second clock signal among the clock signals, wherein a reset terminal of the second latch circuit is coupled to the first latch circuit, and the second latch circuit is selectively reset based on an output of the first latch circuit; and
    a switching circuit coupled to an output terminal of the first latch circuit and an output terminal of the second latch circuit, wherein the switching circuit selects one of the clock signals as an output clock signal of the clock switching device based on the latched selection signals,
    wherein the first latch circuit comprises:
        a first flip-flop having an input terminal configured to receive the first selection signal, wherein a trigger terminal of the first flip-flop receives the first clock signal; and
        a second flip-flop having an input terminal coupled to an output terminal of the first flip-flop, wherein a first output terminal of the second flip-flop is coupled to the switching circuit to provide the first latched selection signal among the latched selection signals, a second output terminal of the second flip-flop is coupled to the reset terminal of the second latch circuit to reset the second latch circuit, and a trigger terminal of the second flip-flop receives the first clock signal.

2. The clock switching device according to claim 1, wherein one of the trigger terminal of the first flip-flop and the trigger terminal of the second flip-flop is a rising-edge trigger terminal, and the other one of the trigger terminal of the first flip-flop and the trigger terminal of the second flip-flop is a falling-edge trigger terminal.

3. The clock switching device according to claim 1, wherein the trigger terminal of the first flip-flop and the trigger terminal of the second flip-flop are each a rising-edge trigger terminal or a falling-edge trigger terminal.

4. The clock switching device according to claim 1, wherein the switching circuit comprises:
    a first clock gating cell having a control terminal coupled to the first latch circuit to receive the first latched selection signal, wherein an input terminal of the first clock gating cell receives the first clock signal;
    a second clock gating cell having a control terminal coupled to the second latch circuit to receive the second latched selection signal, wherein an input terminal of the second clock gating cell receives the second clock signal; and
    an OR gate having a first input terminal and a second input terminal respectively coupled to an output terminal of the first clock gating cell and an output terminal of the second clock gating cell, wherein an output terminal of the OR gate outputs the output clock signal of the clock switching device.

5. The clock switching device according to claim 1, wherein the switching circuit comprises:
    a multiplexer having a first input terminal coupled to the output terminal of the first latch circuit, wherein a second input terminal of the multiplexer is coupled to the output terminal of the second latch circuit, and an output terminal of the multiplexer outputs the output clock signal of the clock switching device.

6. The clock switching device according to claim 1, further comprising:
    a third latch circuit configured to latch a third selection signal among the selection signals based on triggering of a third clock signal among the clock signals, wherein an output terminal of the third latch circuit is coupled to the switching circuit, a reset terminal of the third latch circuit is coupled to the first latch circuit, and the third latch circuit is selectively reset based on the output of the first latch circuit.

7. A clock switching device comprising:
    a first latch circuit configured to latch a first selection signal among a plurality of selection signals for outputting a first latched selection signal among a plurality of latched selection signals based on triggering of a first clock signal among a plurality of clock signals;
    a second latch circuit configured to latch a second selection signal among the selection signals for outputting a second latched selection signal among the latched selection signals based on triggering of a second clock signal among the clock signals, wherein a reset terminal of the second latch circuit is coupled to the first latch circuit, and the second latch circuit is selectively reset based on an output of the first latch circuit; and
    a switching circuit coupled to a first output terminal of the first latch circuit and an output terminal of the second latch circuit, wherein the switching circuit selects one of the clock signals as an output clock signal of the clock switching device based on the latched selection signals,
    wherein the second latch circuit comprises:
        a first flip-flop having an input terminal configured to receive the second selection signal, wherein a trigger terminal of the first flip-flop receives the second clock signal, and a reset terminal of the first flip-flop is coupled to a second output terminal of the first latch circuit different from the first output terminal of the first latch circuit; and
        a second flip-flop having an input terminal coupled to an output terminal of the first flip-flop, wherein an output terminal of the second flip-flop is coupled to the switching circuit to provide the second latched selection signal among the latched selection signals, a reset terminal of the second flip-flop is coupled to the second output terminal of the first latch circuit, and a trigger terminal of the second flip-flop receives the second clock signal.

8. The clock switching device according to claim 7, wherein one of the trigger terminal of the first flip-flop and the trigger terminal of the second flip-flop is a rising-edge trigger terminal, and the other one of the trigger terminal of the first flip-flop and the trigger terminal of the second flip-flop is a falling-edge trigger terminal.

9. The clock switching device according to claim 7, wherein the trigger terminal of the first flip-flop and the trigger terminal of the second flip-flop are each a rising-edge trigger terminal or a falling-edge trigger terminal.

* * * * *